United States Patent [19]

Yamaguchi et al.

[11] Patent Number: 4,951,251
[45] Date of Patent: Aug. 21, 1990

[54] SEMICONDUCTOR MEMORY DEVICE

[75] Inventors: Yasunori Yamaguchi, Tachikawa; Jun Miyake, Musashino, both of Japan

[73] Assignee: Hitachi, Ltd., Tokyo, Japan

[21] Appl. No.: 224,375

[22] Filed: Jul. 26, 1988

Related U.S. Application Data

[62] Division of Ser. No. 874,106, Jun. 13, 1986, Pat. No. 4,766,570.

[30] Foreign Application Priority Data

Jun. 17, 1985 [JP] Japan .................................. 60-129826

[51] Int. Cl.$^5$ .............................................. G11C 7/00
[52] U.S. Cl. ........................ 365/189.02; 365/230.02; 365/222
[58] Field of Search ............... 365/189, 222, 230, 233, 365/149, 210, 189.02, 230.02

[56] References Cited

U.S. PATENT DOCUMENTS

| | | | |
|---|---|---|---|
| 4,482,985 | 11/1984 | Itoh et al. ............................ | 365/226 |
| 4,660,180 | 4/1987 | Tanimura et al. ................... | 365/222 |
| 4,680,737 | 7/1987 | Oishi et al. .......................... | 365/222 |
| 4,766,570 | 8/1988 | Yamaguichi et al. ............... | 365/189 |

Primary Examiner—Joseph A. Popek
Attorney, Agent, or Firm—Antonelli, Terry, Stout & Kraus

[57] ABSTRACT

A semiconductor memory device is provided with a memory portion, a logical operation circuit which receives the data signal read out from such memory portion and the input data signal to form data to be offered to such memory portion, and a gate circuit. In case a data input operation is required which eliminates the logical operation, the input data signal is fed not via the logical operation circuit, but via the gate circuit directly to the memory portion. The semiconductor memory device constructed as above permits a high speed operation and is suited for use as the memory for image processing.

42 Claims, 7 Drawing Sheets

SEMICONDUCTOR MEMORY DEVICE

This is a divisional of application Ser. No. 874,106, filed June 3, 1986, now U.S. Pat. No. 4,766,570.

BACKGROUND OF THE INVENTION

The present invention relates to a semiconductor device and more particularly to a device wherein random access memories (RAM) are used for processing images.

One type of RAM used for image processing fir displaying characters and images on the screen of a display such as CRT (cathode ray tube) is, the serial access memory which is described in, for example "Nikkei Electronics" pp. 219 to 239, issued Feb. 11, 1985 Nikkei MacGraw-Hill. In this RAM, the counter circuit for forming the address signal is included which is made to operate by the control signal and the timing signal which are fed from the exterior terminal so that the selective signal of the word line of the memory array may be formed. Furthermore, data lines of the memory array are connected parallel with the data register via the switching circuit so that data may be serially transfered or received between this data register and the external terminal. In this way, since transfer and reception of data are conducted serially to and from the external terminal, pixel data which is synchronized with the raster scan timing of the CRT can be easily performed. However, though the above-mentioned RAM for processing the image is apparantly composed of a RAM, it can perform the action of a shift register having the number of bits which is equal to its memory capacity. Accordingly, each memory is accessed only once each time the number of bits are accessed. As a consequence, when this kind of RAM is used, a problem arises that the image processing action is retarded with regards to preparation and modification of graphics.

Accordingly, it is very desirable to provide a RAM which is more convenient for the image processing. In view of the above fact, the present inventor has suggested constructing a RAM for processing the image (i.e., a so-called video RAM) by using a RAM which can accessed to in a unit of a plurality of bits (See, for example, "Hitachi IC Memory Disc" issued Sept. 1983, Hitachi Seisakusho K.K.). The above-mentioned 4-bit signals are designaged for processing the colored image, each comprising red, blue, green and brightness signals. However, even when such RAM is used, the memory access action and the action of microprocessor over a plurality of cycles are necessary, in which image data is once read out for preparing or modifying graphics and the logical operation is effected between the read image data and the new image data or data on the indicated conditions and then the result is written again into the original memory address.

SUMMARY OF THE INVENTION

An object of the present invention is to provide a semiconductor memory device having a function suitable for high speed processing of images.

Another object of the present invention is to provide a semiconductor memory device which can be operated itself at a high speed.

The above-mentioned and other objects and the novel features of the present invention will be evident from the description of this specification and appended drawings.

A summary of representative embodiments which are disclosed in the present specification is as follows.

A semiconductor memory device is provided with logical operation circuits and gate circuits which form data which is to be sent to a memory portion, receiving data signal and input data signal read out from the memory portion. In case data input action is requested wherein no logical operation is needed, the input data signal is fed directly to the memory portion not via the logical operation circuit but via the gate circuit.

According to a preferred embodiment of the present invention, a logical operation which is to be effected by the logical operation circuit is instructed by the function signal which is to be fed from the address terminal.

Figure 1:
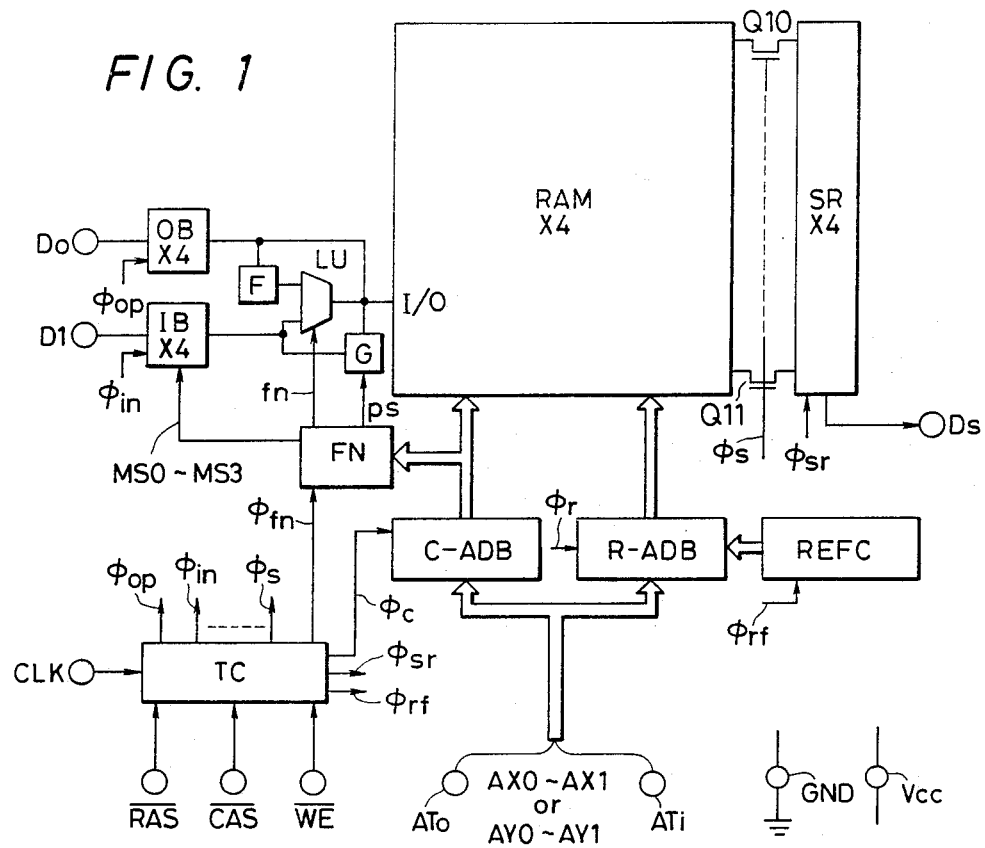
FIG. 1 shows a block diagram of a RAM, illustrating an embodiment of the present invention, FIGS. 2, 3, 4 and 5 respectively show a timing chart, illustrating one example of its operation.

PREFERRED EMBODIMENTS OF THE INVENTION:

FIG. 1 shows a block diagram of one embodiment of the present invention. Each circuit block of the same figure is formed on a semiconductor wafer such as a monolithic silicon in accordance with the known technique for manufacturing the semiconductor integrated circuit, though not especially confined thereto.

A semiconductor memory device according to the present invention is provided with a terminal $\overline{RAS}$ for the row address strobe signal, a terminal $\overline{CAS}$ for the column address strobe signal, a terminal $\overline{WE}$ for the write enable signal, and a terminal CLK for the shift control clock signal as well as a group of data output terminals Do a group of data input terminals Di, a group of data output terminals Ds, terminals ATo to ATi for address signal, power supply terminal and a reference potential terminal or earth terminal. The row address signals AYo to AYi are fed to the address terminal STo to ATi in a time sharing fashion in accordance with the so-called address multiplex system. The input signal, for the function setting circuit FN, which will be described later is fed to the address terminal.

Though not particularly confined thereto, this semiconductor is so constructed that it can be simultaneously accessed to by 4-bit data signal, in other words, in ×4 bit pattern. Consequently, though the group of data output terminals Do, group of data input terminals Di and the group of serial data output terminals Ds are illustrated in FIG. 1 as if they illustrated as if composed of a single terminal, they are actually each composed of four terminals.

A semiconductor memory device according to the embodiment is attached with an internal circuit for processing the image at a high speed which will be described later together with ×4 bit pattern dynamic type memory portion RAM. Though not particularly confined thereto, RAM at the portion of memory in the same figure is composed of four sets of memory arrays which correspond one to one to each bit of the data signal, sense amplifier and the address decoder. A set of memory array, sense amplifier and address decoder are shown in, for example, FIG. 6. The memory array portion includes a dynamic type memory cell comprising MOSFET Qm for selecting the address (insulated gate type field-effect transistor) and the dynamic type memory cell. MOSFET Qm for selecting the address of the above memory cell is coupled with the word line WL to which the gate corresponds and is coupled with one of the complementary data lines DL and $\overline{DL}$ to which the drain corresponds. In reading the data, data signal which was read out from the memory cell P.C. amounting to one word line is given to the complementary data line of the memory array and is transferred parallel via switches MOSFET Q10, Q11 etc. to each bit of four sets of shift registers SR. These MOSFET Q10 and Q11 are controlled by the timing signal $\phi s$ which is fed commonly to its gate. The transfer timing of the above data signal is controlled by the timing signal $\phi s$. The shift register SR is substantially operated as the parallel to serial converter. Such a function, in which the stored information which amounts to one word line in the memory array is read out parallel to convert it into four serial signals by four sets of shift registers SR to send each signal to the external terminal Ds, is useful in generating the graphics data such as red, blue, green colors and the luminance constituting colored pixels which are to be displayed in the synchronized relation with the raster scanning timing of CRT.

Figure 3:
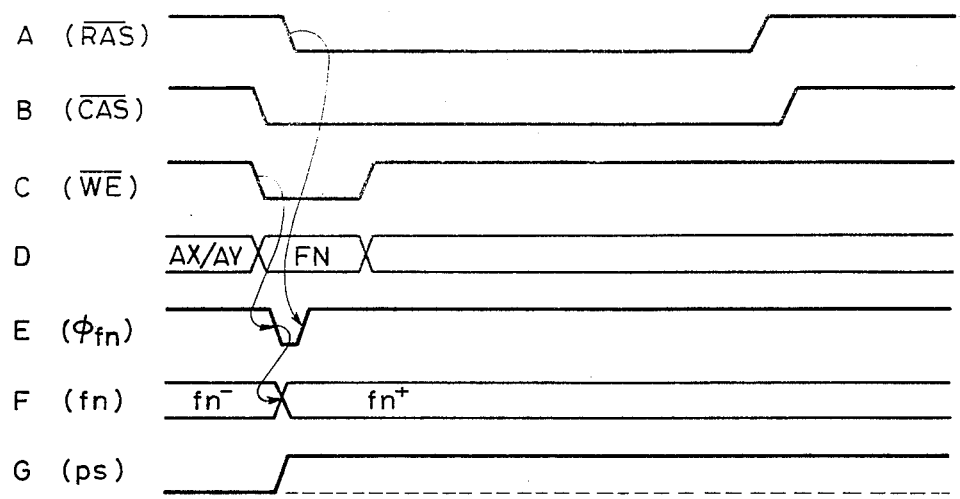

The row address buffer R-ADB is formed in accordance with the low address strobe signal $\overline{RAS}$, takes in the external address signals AXo to AXi in the synchronized relation with the timing signal $\phi r$ and forms the internal complementary signal which is to be transmitted to the row address decoder R-DCR in the memory portion of FIG. 3. The row address decoder R-DCR which is included in the RAM at the memory portion, as will be described later, decodes its address signal, while performing the selective action of the predetermined word line and the dummy word line in synchronized relation with the word line selection timing signal.

The column address buffer C-ADB taskes in external address signals AYo to AYi in synchronized relation with the timing signal $\phi c$ which is formed, in the usual memory access, in accordance with the color address strobe signal $\overline{CAS}$ which is fed later than the row address strobe signal and transmits them to the column address decoder C-DCR of FIG. 3. The column address decoder C-DCR which is contained in RAM of the memory portion decodes its address signal, while performing the selective action of data line in synchronized relation with the data line selection timing signal $\phi y$.

In this embodiment, address terminals ATo to ATi mainly receive row address signals AXo to AXi and column address signals AYo to ATi, but is made it possible to receive the function signal for controlling the data input circuit IB, logical operation circuit LU and the gate circuit G under the predetermined condition to be described later. Correspondingly, the column address buffer C-ADB, for example, takes in the above mentioned address signals AYo to AYi, while taking in the function signal which is fed via the above address terminal under the given condition of operation, transmitting them to the function setting circuit FN.

Incidentally, it is also possible to feed the output of low address buffer R-ADB to the function setting circuit FN. However, as will be described in more detail later, the above described construction is preferred in order to allow the refresh operation and the preset operation for the function data to be effected simultaneously.

The above mentioned function setting circuit FN decodes signals which are taken in through the above column address buffer C-ADB, when its input operation is controlled and is put into the input operation, and though not confined thereto, generates the operation made signal fn for setting the operation mode of the logical operation circuit LU, mask signals MS0 to MS3 for selectively nullifying the operation of data input circuit IB, and the pass signal ps for controlling the gate circuit G so as to transmit the output signal of the above data input circuit IB directly to the input/output node I/O of RAM at the memory portion without passing it to the logical operation circuit LU or the like.

The above logical operation circuit LU is composed of four sets of circuits which correspond to four sets of circuits which correspond to RAMs at the memory portion and receives data signals from the latch circuit F provided at one of the inputs and the write signals which are fed through data input circuit IB from the external terminal Di and performs the logical operation such as AND, NAND, OR, NOR, inversion and Exclusive OR or the like in accordance with its operation mode signal fn.

The above-mentioned latch circuit F is coupled to the input/output node I/O of RAM at the memory portion to which its input terminal corresponds for holding the stored information of the selected memory cell. The logical operation circuit LU may be composed of, for example, a plurality of logical gate circuits and a multiplexer circuit for switching its signal transmission route. A more preferred example of the logical operation circuit LU will be described later with reference to FIG. 8.

Hereby, when the data write signal which is fed from the external signal Di is to be written as it is into RAM at the memory portion, if the write signal is fed to RAM at the memory portion via the above logical operation circuit LU in which the delay time is relatively small in the propagation of signal, the transmission of signals can be delayed by the signal transmission time of the circuit LU. The gate circuit G transmits the output signal of the above data input circuit IB as it is to the input/output node I/O of RAM at the memory portion through the control of the above pass signal ps. The write operation can be effected at a high speed in accordance with such an operation.

Data input circuit IB is composed in all of four sets of circuits and its operation is controlled by the timing signal $\phi in$. When the data input circuit IB is put into the status of operation by the timing signal $\phi in$, it amplifies each 4-bit write signal which is fed from the external terminal Di and forms the internal write signal. The data input circuit IB is also selectively nullified in accordance with mask signals MSO to MSS which are formed by the above function setting circuit FN. In other words, among above four sets of circuits, the operation of any circuit can be nullified. Such a mask operation to the external write signal can be deemed to be convenient, when one to three signals are selectively input out of one pixel data comprising the red, blue, green, and luminance signals.

The data output circuit OB is composed in all of four sets of circuits and its operation is controlled by the timing signal $\phi$op. When it is put into the status of operation by the timing signal $\phi$op, it each amplifies signals amounting in all to 4-bit at the input/output node I/O to which RAM at the memory portion corresponds and sends them out to the external terminal Do.

The timing control circuit TC receives address strobe signals $\overline{RAS}$ and $\overline{CAS}$, write enable signal $\overline{WE}$ and the clock signal CLK for the operation of the shift register SR, discriminates the operation mode indicated by the combination of those signals and further forms a variety of timing signals which are necessary for the operation of the internal circuit, in addition to timing signals $\phi$c, $\phi$r, $\phi$fn etc. shown by way of example.

The timing control circuit TC is composed of a plurality of logical gate circuits, signal delay circuit and signal hold circuit.

However, no specific internal construction of the timing control circuit TC is shown, since it ca be relatively easily decided if the relationship between the input control signal and the timing signal to be obtained based thereon becomes clear. Basically, the timing control circuit is constructed such that the operation mode can be discriminated in the following manner. Namely, the timing control circuit TC regards the preset operation mode as being indicated by the combination of those signals, if the column address strobe signal $\overline{CAS}$ and the write enable signal $\overline{WE}$ are set on the enable level such as the low level at the timing when the row address strobe signal $\overline{RAS}$ set from the inactive level such as the high level to the active level such as the low level. Though not particularly confined thereto, the reset operation mode is continued until the row address strobe signal $\overline{RAS}$ is set again to the high level. In this preset operation mode, the timing control circuit TC generates the timing signal $\phi$fn for making the function setting circuit FN take in data signals.

The timing control circuit TC also regards the access operation as being indicated if the write enable signal $\overline{WE}$ is set on the high and disable level by the combination of those signals at the timing when the row address strobe signal $\overline{RAS}$ is varied from the high level to the low level.

The refresh control circuit REFC, though not particularly confined thereto, includes a refresh address counter circuit (now shown) for forming the refreshing address signal. The timing control circuit TC regards the refresh operation mode as being indicated, if the column address strobe signal $\overline{CAS}$ is set on the low level prior to the row address strobe signal $\overline{RAS}$. At this time, if the row address strobe signal $\overline{RAS}$ is set on the low level, the timing control circuit TC forms the refresh signal $\phi$rf in synchronized relation therewith. Receiving this refresh signal, the refresh address counter circuit performs the stepping operation (counting operation). At the time of refresh operation mode, the refreshing address signal which was formed in the refreshing address counter circuit within the above refresh control circuit REFC is transmitted to the input of the row address buffer R-ADB, through which it is fed to the row decoder of RAM at the memory portion.

Figure 6:
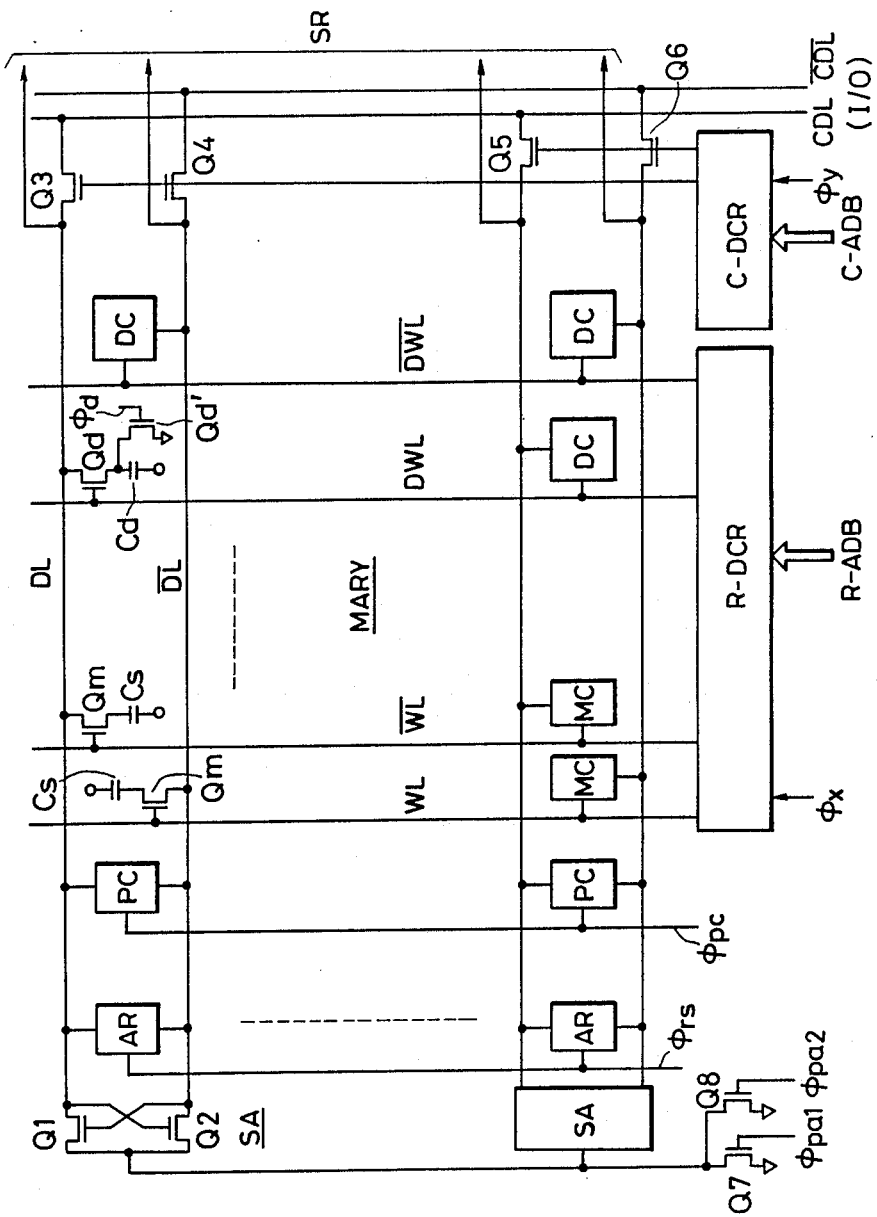
FIG. 6 shows a circuit diagram illustrating an example of a memory portion of FIG. 1.

In FIG. 6 is shown a circuit diagram according to one embodiment of the above RAM at the memory portion. 1-bit memory cell MC, as shown by way of the representative example, is composed of an information storing capacitor Cs and MOSFET Qm for selecting the address and the logic "1" or "0" is stored depending on the presence or the absense of electric charge on the capacitor Cs. The information stored is read out by coupling the capacitor Cs to the common data line DL, with MOSFET on, and sensing how the potential of data line DL had been varied depending on the amount of charges which had been accumulated in the capacitor Cs.

In case of the highly integrated memory of large capacity, since the memory cell is made smaller and numerous memory cells are coupled to the data line DL, the ratio (Cs/Co) between the above capacitor Cs and the stray capacity Co (not shown) of the data line DL becomes very small. Consequently, depending on the amount of charges accumulated to the above capacitor Cs, the variation of potential imparted to the data line DL or the signal attains a very minor value. In order to form the reference potential to detect such a minor signal, the dummy cell DC is provided.

Though not particularly confined thereto, this dummy cell is made in accordance with the same manufacturing conditions and the design constant as in the memory cell MC, except that its capacity of capatitor Cd is substantially as half as the capacitor Cs of the memory cell MC. Prior to the addressing, the capacitor Cd is discharged by MOSFET Qd' to the earth potential. As shown above, since the capacity of the capacitor Cd is set about half as much as the one of the capacitor Cs, reference voltage which is equal to about the half of the signal read out from the memory cell MC is formed.

The number of memory cells which are coupled to a pair of parallel disposed complementary data lines DL and $\overline{DL}$ (reflected bit line or digit line) is made equal to elevate the detection accuracy. Though not particularly confined thereto, one dummy cell DC is coupled to each complementary data line DL and $\overline{DL}$. Furthermore, each memory cell MC is coupled between one word line WL and either of the pair of complementary data lines. Since each word line WL intersects with both of the pair of data lines, even if the coupling noise has emerged to one of the pair of data lines due to the electrostatic coupling, the noise which is substantially equal to the coupling noise also emerges to the other of the pair of data lines. A differential type sense amplifier as will be described later is substantially insensitive to the above noise, i.e. common mode noise. In case, in addressing, the memory cell MC coupled to one of the pair of complementary data lines DL and $\overline{DL}$ is selected, either of the pair of dummy word lines DWL and $\overline{DWL}$ is selected such that the dummy cell DC may not fail to be coupled to the other data line.

Though not particularly confined thereto, the sense amplifier SA has a pair of intersectingly connected MOSFET Q1 and Q2 and, by the positive feedback action of the signal caused by these MOSFETs, it amplifies the minor signal which has emerged to the complementary data lines DL and $\overline{DL}$ in the differential manner. Though not particularly confined thereto, this positive feed back action is performed as follows in two steps. Namely, the first step operation is initiated at the same time as MOSFET Q7 which has acquired a relatively small conductance starts to be electrically conductive. At this time, in accordance with the potential which is applied to complementary data lines DL and $\overline{DL}$ by addressing, the higher and lower potentials of the data lines are lowered respectively at a lower and a faster speed in such a way that the difference therebetween may be widened. The second step operation is initiated at the timing when the above difference has become greater to a certain extent. Namely, MOSFET Q8 which has acquired a relatively large conductance becomes conductive by the timing signal $\phi pa2$. As a consequence, the above lower potential of data line is rapidly reduced. As shown above, the operation of sense amplifier SA is made to be effected by dividing it into two steps to prevent the excessive drop of the higher potential. Thus when the lower potential is reduced below the threshold voltage of the intersectingly coupled MOSFET, the positive feedback is completed and the higher potential remains to be below the power voltage Vcc and above the above threshold voltage, while the lower potential ultimately reaches the earth potential (OV).

During the above addressing, the information stored in the memory cell which was going to be once destructed is resumed since the high or the low level potential which was obtained by this sensing action is fed as it is. However, as described above, if the high level potential has dropped above a certain extent relative to the power voltage Vcc, the erroneous action can occur in which the high level of voltage is read out as the logic "0", meanwhile reading and rewriting are several times repeated. An active restore circuit AR is provided to prevent the occurrence of this malfunction. This active restore circuit AR serves to selectively boost only the high level signal up to the potential of power voltage Vcc without imparting any effect on the low level signal.

The precharge circuit PC, as shown, is each coupled between complementary data lines and is operated by the timing signal $\phi pc$ in such a way that, prior to the start of selection of memory cell, each of complementary data lines DL, $\overline{DL}$ may be set to the precharge level.

A pair of data lines DL and $\overline{DL}$ which are shown in the same figure by way of the representative example are connected via MOSFET Q3 and Q4 which constitutes a column switch CW to a pair of complementary common data lines CDL and $\overline{CDL}$. The other pair of data lines which are shown by way of the representative example are also connected via the similar MOSFET Q5 and Q6 to the pair of complementary common data lines CDL and $\overline{CDL}$. This pair of complementary common data lines CDL and $\overline{CDL}$ corresponds to the input/output node I/O shown in FIG. 1. Following signals are formed by the timing control circuit TC shown in FIG. 1: timing signals $\phi pa1$, $\phi pa2$, $\phi rs$, $\phi pc$ for the control of operation of the sense amplifier SA, active restore circuit AA and the precharge circuit PC, timing signal $\phi d$ for the reset of the dummy memory cell DC, word line selection timing signal $\phi x$ for the row address decoder R-DCR, and data line selection timing signal $\phi y$ for the column address decoder C-DCR.

The time sequence of the operation of the memory portion shown in FIG. 6 is substantially identical with the one of the known dynamic type RAM. Therefore, the description of the operation of each circuit is omitted.

Each of complementary data lines DL and $\overline{DL}$ in the memory array MARY constructed as above is coupled via switches MOSFET Q10, Q11 etc. shown in FIG. 1 to the input terminal to which the shift register SR in FIG. 1 corresponds. The read signal of the memory cell which was sent from the memory cell PL coupled to one selection word line to complementary data lines DL and $\overline{DL}$ and was amplified by the operation of the above sense amplifier SA, and the active restore circuit AR is transmitted parallel to the shift register in the synchronized relation with the timing signal $\phi s$.

Receiving the internal complementary address signal which was respectively formed by the above row address buffer R-ADB and the column address buffer C-ADB, the row address decoder R-DCR and the column address decoder C-DCR form the selective signal for the word line and the dummy-word line and the column switch selection signal. Thus addressing of the memory cell and dummy cell is performed. Namely, the row address decoder R-DCR decodes the internal complementary address signal which is fed from the row address buffer R-ADB and selects one word line and the dummy word line which corresponds thereto in the synchronized relation with the word line selection timing signal $\phi x$.

The column address decoder C-DCR decodes the internal complementary address signal which is fed from the column address buffer C-ADB and forms the selective signal transmitted to the gate of the column switch MOSFET which couples a pair of complementary data lines to the common complementary data line in the synchronized relation with the data line selection timing signal $\phi y$.

Figure 2:
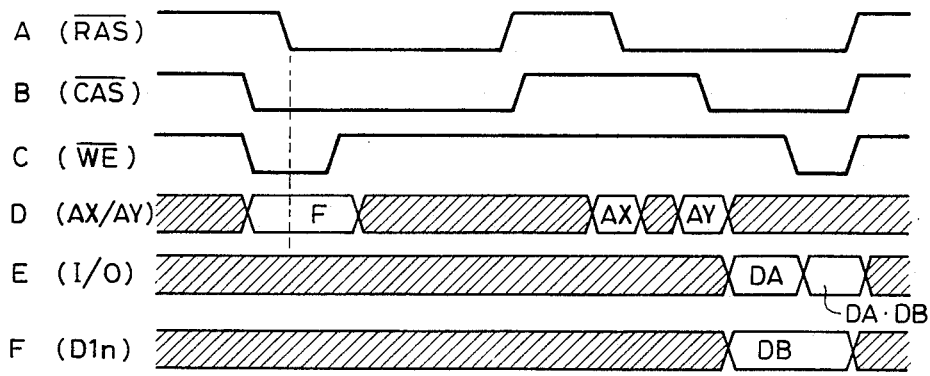
Figure 4:
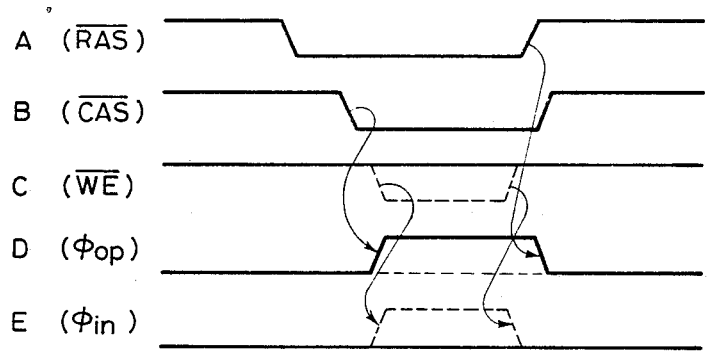

Next, one example of the operation of semiconductor memory device according to the present invention is described in accordance with the timing charts shown in FIG. 2 to FIG. 4.

First of all, the refresh action is as follows. Before the row address strobe signal $\overline{RAS}$ is varied from the high level to the low level, the column address strobe signal $\overline{CAS}$ and the write enable signal $\overline{WE}$ are set on the low level, as shown respectively in FIG. 2, B and C. FIG. 2, B and C show the waveform when the refresh action as well as the set action to be described later are instructed. The instruction of the refresh action is not affected by the write enable signal $\overline{WE}$. If, like this, the column address strobe signal $\overline{CAS}$ is set beforehand on the low level, the timing control circuit TC starts to control the refresh action mode. Namely, the timing control circuit TC decides that the column address strobe signal $\overline{CAS}$ is on the low level at the timing when the row address strobe signal $\overline{RAS}$ which is substantially a chip selection signal is transferred from the high level to the low level and, as its result, generates the refresh control signal $\phi rf$, while generates a variety of timing signals for a variety of circuits to be operated in the refresh cycle ($\overline{CAS}$ before $\overline{RAS}$ refresh). The input terminal of the row address buffer R-ADB is coupled to the output terminal of the refresh control circuit REFC such that the output of the refresh control circuit REFC may be selected by the refresh control signal $\phi rf$ and is separated from the external address terminal ATo to ATi. Correspondingly, the refresh address signal which was formed in the refresh control circuit REFC is transmitted via the row address buffer R-ADB to the row address decoder R-DCR. The timing control circuit TC generates a variety of timing signals for the row circuits in RAM at the memory portion. As its result, the selective action of the word line and the refresh action caused by a series of action of the sense amplifier SA and the active restore circuit AR are performed.

The input of data to the function setting circuit FN is performed as follows.

The preset action mode for the function setting circuit FN is, as shown above, instructed in such a way that the column address strobe signal $\overline{CAS}$ and the write enable signal $\overline{WE}$ are transferred to the low level before the row address strobe signal $\overline{RAS}$ is set to the low level.

The timing control signal $\overline{TC}$, if it had been set beforehand to the low level as shown in FIGS. 2(C) and FIG. 3(C), generates the timing signal $\phi c$ for activating the column address buffer C-ADB and the timing signal $\phi fn$ shown in FIG. 3(F) for driving the function setting circuit FN in response to the variation of the above row address strobe signal $\overline{RAS}$ to the low level. The function signal F which is fed at the timing shown in FIG. 2(D) to the external terminal ATo to ATi is taken in to the column address buffer C-ADB since the timing signal $\phi c$ is generated. The function setting circuit FN is put into the state of input operation since the timing signal $\phi fn$ is generated. Consequently, the function signal which is taken into the above column address buffer C-ADB and output therefrom is taken at this time into the function setting circuit FN. The function setting circuit FN holds the above function signal F taken therein, while decoding it to form a variety of operation mode signals for a variety of operations to be described later.

As shown in FIG. 2(A) to (C) and FIG. 3(A) to (C), when the write enable signal $\overline{WE}$ is set on the low level prior to the variation of the row address strobe signal $\overline{RAS}$ onto the low level, while the column address strobe signal $\overline{CAS}$ is also set to the low level, the above preset action as well as the refresh action is correspondingly effected. Hereby, in the refresh action, no data line selection timing signal $\phi y$ which is the timing signal associated with the column is necessary. Furthermore, no operation of the column address decoder C-DCR is necessary in the execution of the refresh action. Therefore, the column address decoder C-DCR, as described above, can be utilized for the input of function signal F. Like this, the refresh action and the function signal F take-in action are effected concurrently during the same operation cycle (refresh cycle).

When the above address strobe signals $\overline{RAS}$ and $\overline{CAS}$ and the write enable signal $\overline{WE}$ are set on the high level, the internal circuit (now shown) in the timing control circuit TC is correspondingly put into the reset status. In this reset status, too, the above function setting circuit FN is constructed such that it may hold the above take-in function signal F. When the preset action is again performed, the function signal F within the function setting circuit N is correspondingly altered.

Next, the normal memory access is made as follows.

Under the condition in which the preset action mode is not indicated, i.e. under the condition in which the write enable signal WE is not set beforehand on the low level, when the row address strobe signal $\overline{RAS}$ is varied from the high level to the low level, the timing control circuit TC generates the timing signal $\phi r$ in response thereto. The row address buffer R-ADB is put into the operated state in response to the timing signal $\phi r$ and takes the address signal which was fed from the external address terminals ATo to ATi as the row address signal AX (AXo to AXi). Then the above timing control circuit TC generates the word line selection timing signal $\phi x$ for the row circuit of RAM at the memory portion $\phi y$, sense amplifier operation timing signal $\phi pa1$ and $\phi pa2$ and the active restore operation timing signal $\phi rs$ in time series and as the result allows the selective operation of the low level circuit.

When, subsequent to the variation of the row address strobe signal $\overline{RAS}$, the column address strobe signal $\overline{CAS}$ is varied from the high level to the low level, the timing control circuit TC generates the timing signal $\phi c$ in response thereto. The column address buffer C-ADB is put into the operated state by the timing signal $\phi c$ and takes the address signal which was fed from the external address ATo to ATi as the column address signal AY (AYO to AYi). After that, the above timing control circuit TC generates the above data line selection timing signal $\phi y$ (not shown) and allows the selection of data line to be performed. Namely, the information DA stored in the memory cell which was designated by address signals AX and AY is offered to the common complementary data lines CDL and $\overline{CDL}$ (input/output node I/O). The store information DA at the input/output node I/O is taken into the latch circuit F. The data take-in operation of the latch circuit F is controlled by the following timing signal which is output form the timing control circuit TC. Namely, the timing signal for the latch circuit F is generated for a predetermined period of time after the column switch circuit C-SW (FIG. 6) is operated by the data line selection timing signal $\phi y$. Thanks to such a control of the latch circuit F by the timing signal, the undesirable amendment of data held by the latch circuit F is prevented when the signal is output from the logical operation circuit LU which will be described later.

As the result of such an operation, it is substantially decided as follows by the write enable signal $\overline{WE}$, how the information fed to the input/output node I/O is processed.

In case the write operation mode is designated by the write enable signal $\overline{WE}$ being set to the low level, the timing signal $\phi in$ is generated which operates the data input circuit IB. Correspondingly, the write signal DB fed from the external terminal Di is taken into the data input circuit IB.

FIG. 4(E) shows a timing chart of the timing signal $\phi in$. After the column address strobe signal $\overline{CAS}$ (FIG. 4(B)) was set to the low level and the write enable signal $\overline{WE}$ is set to the low level, as shown by the broken line of FIG. 4, the timing signal $\phi in$ is set correspondingly set to the high level. When the write enable signal $\overline{WE}$ is restored to the high level, the timing signal $\phi in$ is correspondingly set to the low level. If the write enable signal $\overline{WE}$ remains to be on the high level, the timing signal $\phi in$ is maintained on the low level.

The data write signal DB taken into the data input circuit IB and the signal DA taken beforehand into the latch circuit F are fed to the logical operation circuit LU.

If, by the above function setting, the function setting circuit FN is designating the AND operation to, for example, the logical operation circuit LU, the logical operation circuit LU forms the AND signal DA·DB from the signal DA of the above latch circuit F and the above write signal DB and transmit it to the above input/output node I/O. Thus the above signal DA·DB is written in the above selected memory cell. As the result, in the one cycle write operation, the information stored in the memory cell can be replaced by the new pixel data which is obtained as the result of the logical operation of it and the write signal fed from the external terminal.

The operation which can be designated by the setting of the function, though not particularly confined thereto, includes not only the abovementioned operation mode action, but also the selective operation of four logical operation circuits corresponding one to one to 4-bit data signal, the control operation of the gate circuit G and the masking operation which will be described later.

In case, by the above setting of the function, one to three of four logical operation circuits is put into the non-operated status, the operation of the circuit is as follows. Though not particularly confined thereto, the logical operation circuit LU in the non-operated status outputs the data signal which coincides with the output of the latch circuit F, irrespective of the operation of the data input circuit IB. Therefore, the memory array of RAM at the memory portion which is made to correspond to the logical operation circuit LU in the non-operated status maintains the original stored information. The logical operation circuit LU which is in the operated status respectively outputs the result of the operation of the output of the latch circuit F and the output of the data input circuit IB. As the result, the write operation of result of the above logical operation is performed for 3 to 1 bit to RAM at the memory portion. In case the function is set so that the information stored in the memory cell may be replaced by the write signal fed from the external terminal, the operation of the circuit is as follows. Namely, when a new function signal $f_n+$ is set at the timing as shown in FIG. 3(F) to the function setting circuit FN, the pass signal PS as shown in FIG. G is correspondingly output from the function setting circuit FN. The gate circuit G which is provided between the output of the data input circuit IB and the input/output node I/O is opened by the pass signal PS. Thus the write signal which has passed through the data input circuit IB is transmitted not via the above logical operation circuit LU, but via the gate circuit G (tri-state buffer) directly to the input/output node I/O (common complementary data line of the memory array MARY). While the logical operation circuit LU is relatively complicatedly constructed so as to permit the operation of the various operation modes and, as the result, has the relatively long signal propagation delay time, the gate circuit G is relatively simply constructed itself with a relatively short signal propagation delay time. Therefore, in case such a gate circuit G is provided, the high speed write operation is possible as in the prior dynamic RAM.

The other form of operation by the setting of the function is as follows. Namely, in case only the specific bit is written out of 4-bit write signal fed from the external terminal, mask signals MS0 to MS5 are set. The data input circuit IB is put into the non-operated state by mask signals MS0 to MS5. Thus the write signal fed to the external terminal is nullified. This masking function is utilized when the signal fed from the external terminal is written in the specific memory cell only out of four memory cells which are simultaneously selected by the addressing of RAM at the memory portion. Such function can be achieved also by making the gate circuit G selectively operate at the time of bypass mode in which the gate circuit G is used.

According to this embodiment, the function data which was previously set in the previous preset operation is released from the previous status since it is altered, i.e. the new preset operation is performed, and is replaced by the new function data. By so doing, the operation cycle for the setting of function can be smaller.

In the image processing, pixels which constitute a graphic or the image which constitutes the specific area are usually composed of the set of a multiplicity of dots (bits). In case the image is altered, the same logical operation is performed repeatedly to the above multiplicity of dots. Correspondingly, the method whereby the release of the above function setting data is relaced by the setting of new data makes the use of memory convenient.

The read operation is designed identically with the one according to the prior $\times 4$ bit pattern dynamic RAM. In this case, out of 4-bit image pixels, the function or the operation in which the specific bits are masked may be set and such operation can be realized by excluding the processing of the bits at the side of the microprocessor.

In the data read operation, the timing signal $\phi$op which is offered to the data output circuit OB is altered as in FIG. 4(E).

Namely, when the column address strobe signal $\overline{CAS}$ is set to the low level, as in FIG. 4(B), the timing signal $\phi$op is set in response thereto to the high level as shown by the solid line of FIG. 4(E). More specifically, after the data line timing signal $\phi y$ related to the column address strobe signal $\overline{CAS}$ is output, or after the information stored in RAM at the memory portion is offered to the input/output node I/O, timing signal $\phi$op is set to the high level. If the write enable signal $\overline{WE}$ is set to the low level, as shown by the broken line of FIG. 4(C), it is maintained to a low level, as shown by the broken line of FIG. 4(D).

The timing signal $\phi$op which was set once to the high level, though not particularly confined thereto, is set to the low level according as the row address strobe signal $\overline{RAS}$ is set to the high level, in other words, the chip is put from the selective into the non-selective state.

In the read operation, the timing signal $\phi$in for the data input circuit IB is maintained to the low level, as shown by the solid line of FIG. 4(E). Thus the data input circuit IB is put into the non-operated state. Data in the input/output node I/O of RAM at the memory portion is not altered.

Figure 5:
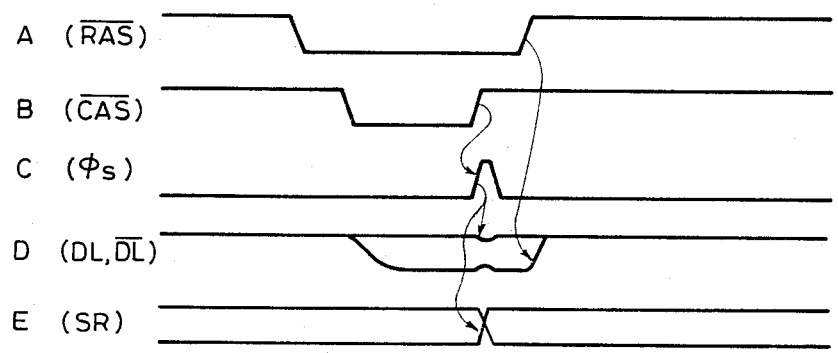

FIG. 5(C) shows a timing chart of the timing signal $\phi$s which is fed to MOSFET Q10 to Q11 a the transmission gate of FIG. 1. The timing signal $\phi$s is formed in accordance with the column address strobe signal $\overline{CAS}$. More specifically, if the column address strobe signal $\overline{CAS}$ is set to the high level, for example, when the row address strobe signal is set to the low level, the timing signal $\phi$s is set correspondingly to the high level for the predetermined period of time. The data read out at each complementary data lines DL and $\overline{DL}$ is fed to the shift register SR in the synchronized relation with the timing signal $\phi$s. As the result, data at the shift register SR is updated, as shown in FIG. 5(E). Incidentally, though not essential, the level of complementary data lines DL and $\overline{DL}$ is temporarily altered, as shown in FIG. 5(D) by the temporary redistribution of electric charges which are produced between complementary data lines DL and $\overline{DL}$ and the input node of the shift register SR when MOSFET Q10, Q11 etc. are switched on.

The serial read operation can be performed in accordance with the substantially similar operation as in the above known serial memory. Namely, the shift clock signal $\phi$sr is output form the timing control circuit TC in response to the clock signal CLK offered from out-side. The shift register SR is operated by this shift clock signal $\phi$sr. According to this embodiment, since the low address can be set at will be the address signal fed from the external terminal, the scroll function of the display screen can be achieved. Namely, the graphic on the display screen can be shifted in the upward or the downward direction by altering the row address which is set in the synchronized relation with the first raster of CRT.

Figure 7:
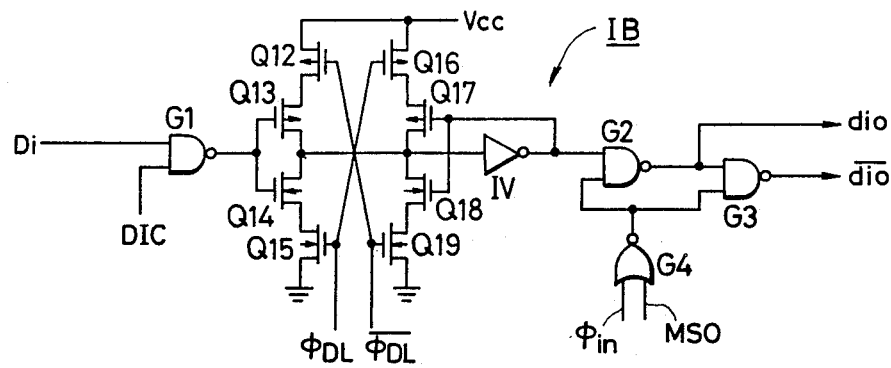
FIG. 7 shows a concrete diagram of the data input circuit.

FIG. 7 shows a specific example of the circuit diagram of the data input circuit IB.

The data input circuit IB is composed of an input gate circuit G1, a data hold circuit or a latch circuit which comprises MOSFET Q12 to Q19 and an inverter circuit IV and an output circuit comprising gate circuits G2 to G4.

The input gate circuit G1 comprises two input NAND circuits and either of the input terminals is coupled to one of the group of terminals D in FIG. 1 and the rest one of terminals is coupled to the timing control circuit TC in FIG. 1. While constituting the input gate, the input gate circuit G1 constitutes a waveform shaping circuit or a level decision circuit for the input signal such as on the TTL level which is fed to the group of terminals D.

The operation of the latch circuit is controlled by the complementary timing signals $\phi$dl and $\overline{\phi dl}$ which are fed from the timing control circuit TC.

The operation of the output circuit is controlled by the timing signal $\phi$in which is fed from the timing control circuit TC and one (MSO) of 4-bit masking signals MS0 to MS3 which are fed from the function seting circuit FN. If it is on the high level, each masking signal is regarded as the masking level and if it is on the low level, is regarded as the non-masking level.

The timing signal fed to the data input circuit LB is shown in FIG. 19.

Figure 9:
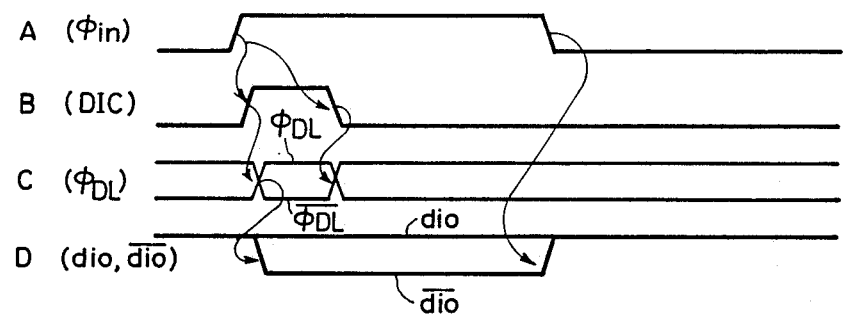

The timing signal $\phi$in is altered, as shown in FIG. 4(E) and FIG. 9(A).

As shown in FIG. 9(B), the timing signal DIC is set to the high level for a predetermined period of time after the timing signal $\phi$in has been set to the high level.

As shown in FIG. 9(C), timing signals $\phi$dl and $\overline{\phi dl}$ are respectively set to the high and low levels in response to the timing signal DIC.

When timing signals $\phi$dl and $\overline{\phi dl}$ respectively set to the high and low level, in response thereto, the latch circuit which comprises MOSFET Q12 to Q19 and the inverter circuit IV takes in the data signal fed via the gate circuit G1. This latch circuit, if timing signals $\phi$dl and $\overline{\phi dl}$ are respectively set to the low and the high level, also holds the data signal which is on the previous level, irrespective of the output of the gate circuit G1.

Figure 10:
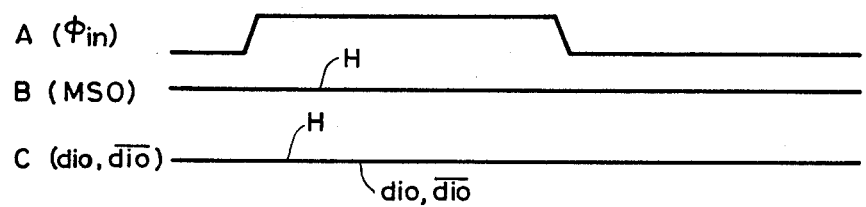

If the mask signal MSO has been set to non-mask level, i.e. low level, the output circuit comprising the gate circuit G2 and G4 is, as shown in FIG. 9(D), set to the effective level in substantially the same period of time as the period of high level state of the timing signal $\phi$in. Namely, one of complementary output signals dio and $\overline{dio}$ is set to the high level, while the other is set to the low level. If the mask signal MSO is set to the mask level, i.e. high level, complementary output signals dio and $\overline{dio}$ are set to the mask level, i.e. high level, as shown in FIG. 10(C), irrespective of the timing signal $\phi$in.

Figure 8:
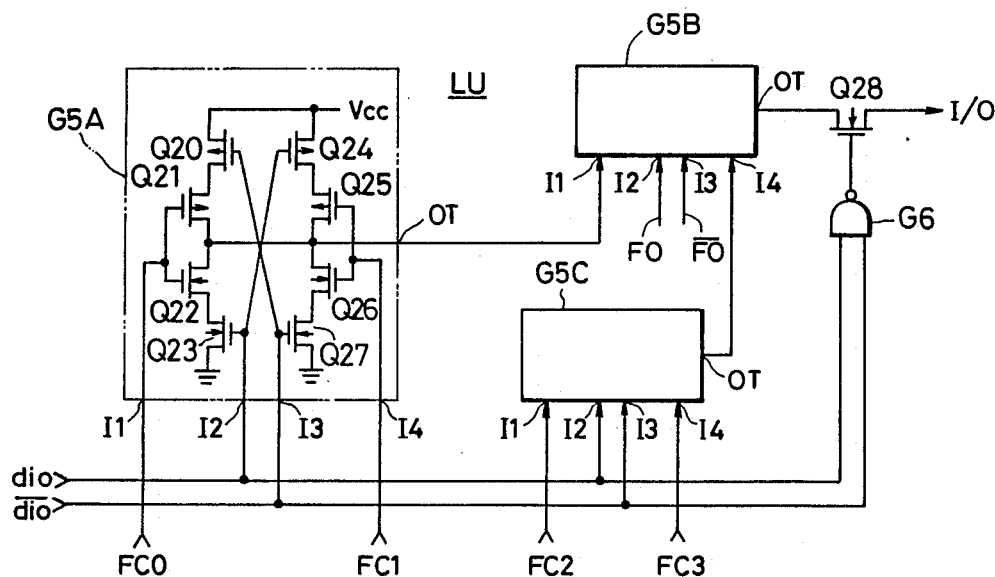
FIG. 8 shows a concrete diagram of a logical operation circuit, FIGS. 9 and 10 respectively show a timing chart, illustrating the operation of the data input cireuit.

FIG. 8 shows a specific example of the logical operation circuit (LU) diagram.

The logical operation circuit LU is composed of logical circuits G5A to G5C and the transmission gate MOSFET Q28.

Logical circuits G5A to G5C are identically constructed. Therefore, to avoid the complication of figure, only the logical circuit G5A is specifically shown. In FIG., the same symbol is assigned to the input and the output terminals to which logical circuits G5A to G5C correspond.

Output signals dio and $\overline{dio}$ of the data input circuit IB are fed to the first input terminals I2 and I3 of logical circuits G5A and G5C, while complementary output signals OF and $\overline{OF}$ of the latch circuit F in FIG. 1 are fed to the first input terminals I2 and I3 of the logical circuit G5B.

Output signals FC0 to FC3 of the function setting circuit FN are fed to the second and the third input terminals I1 and I4 of the logical circuits G5A and G5C, while the output signals of the logical circuits G5A and G5C are fed to the second and the third input terminals I1 and I4 of the logical circuit G5B.

Combinations of the function designating signals FC0 to FC3 number 16 and in accordance with such combinations logical circuits G5A to G5C perform an operational action designated by the function designating signals FC0 to FC3.

When at least one of the input data signals dio and $\overline{dio}$ is set to the low level, the transmission gate MOSFET Q28 is correspondingly switched on.

Therefore, unless outputs dio and $\overline{dio}$ have been masked by the mask signal MS0, the logical circuit LU feeds the result of the operation to the input/output node I/O of RAM at the memory portion at the timing when signals dio and $\overline{dio}$ are set to the complementary level.

If the mask signal MS0 has been set to the mask level, any of signals dio and $\overline{dio}$ is maintained to the high level. Correspondingly, MOSFET Q28 is maintained to the off state. In this case, the level of the input/output node I/O is not of course altered by the logical operation circuit LU.

Figure 11:
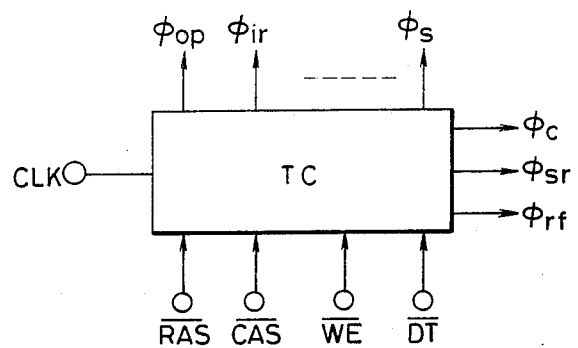
FIG. 11 shows a block diagram of the timing control circuit according to another embodiment, FIGS. 12 and 13 respectively show a timing chart, illustrating the operation of the circuit of FIG. 11.

FIG. 11 shows a block diagram of the timing control circuit TC according to the other embodiment which can be replaced by the timing control circuit TC of FIG. 1.

This timing control circuit TC receives the transfer control signal $\overline{DT}$, along with the shift clock signal CLK, row address strobe signal $\overline{RAS}$, column address strobe signal $\overline{CAS}$, and the write enable signal $\overline{WE}$.

The transfer control signal $\overline{DT}$ is utilized to control the timing signal $\phi$op for the data output circuit OB, timing signal $\phi$in for the data input signal IB, and the timing signal $\phi$s for the transmission gate such as MOSFET Q10 to Q11 in FIG. 1.

Figure 12:
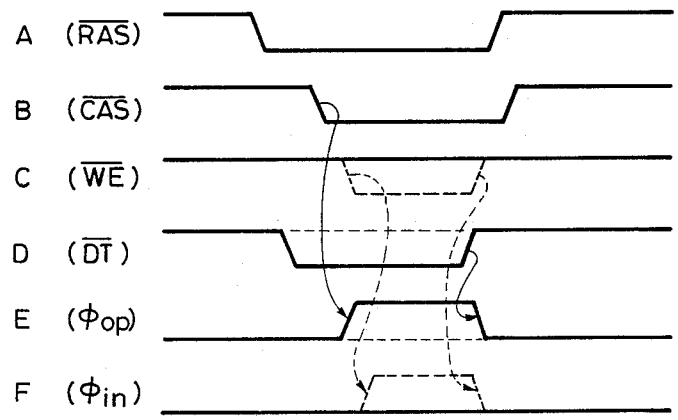

FIG. 12 shows a timing chart of the various signals during the data read and write operation.

When the read operation is to be performed, the transfer control signal $\overline{DT}$ is set to the low level, as shown by the solid line in FIG. 12(D), between the time interval between trailings of the row address strobe signal $\overline{RAS}$ and the column address strobe signal $\overline{CAS}$. If the control signal $\overline{DT}$ had been set like this beforehand to the low level, in response to the change of the column address strobe signal $\overline{CAS}$ to the low level, the timing signal $\phi$op is set to the high level, as shown by the solid line in FIG. 12(E). On the contrary, if the control signal DT is set to the high level, as shown by the broken line, the timing signal φop is made to remain on the low level.

Though not particularly confined thereto, the timing signal φop which has been once set to the high level is set to the low level according as the control signal DT is set to the high level.

At the time of reading operation, the timing signal φin for the data input circuit IB is maintained to the low level, as shown in FIG. 12(F).

While the control signal $\overline{DT}$ is maintained to the high level, if the write enable signal $\overline{WE}$ is set to the low level, as shown by the broken line in FIG. 12(C), the timing signal φin is correspondingly set to the high level.

As described above, in case the output of the timing signal φop is controlled by the control signal $\overline{DT}$, the desirable operation of the circuit becomes possible. Namely, in case no control signal $\overline{DT}$ is used, if the timing of input of the write enable signal is properly set, the timing signal φop can be output by accident before the timing signal φin is output at the time of writing operation. Use of the control signal $\overline{DT}$ makes it possible to prevent such undesirable operation.

Figure 13:
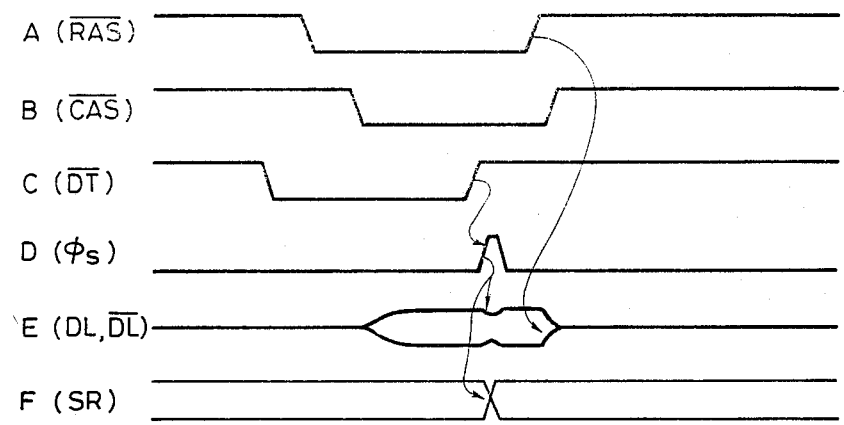

FIG. 13 shows a case where the timing signal φs is formed by the transfer control signal $\overline{DT}$.

Though not particularly confined thereto, in case the row address strobe signal $\overline{CAS}$ and the column address strobe signal $\overline{CAS}$ are altered as in the normal memory access operation, when the transfer control signal $\overline{DT}$ is altered to the low level prior to the change of the row address strobe signal $\overline{RAS}$ into the low level, it is regarded that setting of data to the shift register SR was designated. In this case, the timing signal φs is set to the high level for a predetermined period of time, as shown in FIG. 13(D), in response to the rise of the transfer control signal $\overline{DT}$ to the high level.

FIG. 13(D) shows waveforms of the signals of complementary data lines DL and $\overline{DL}$ at the half-precharge memory portion.

Figure 14:
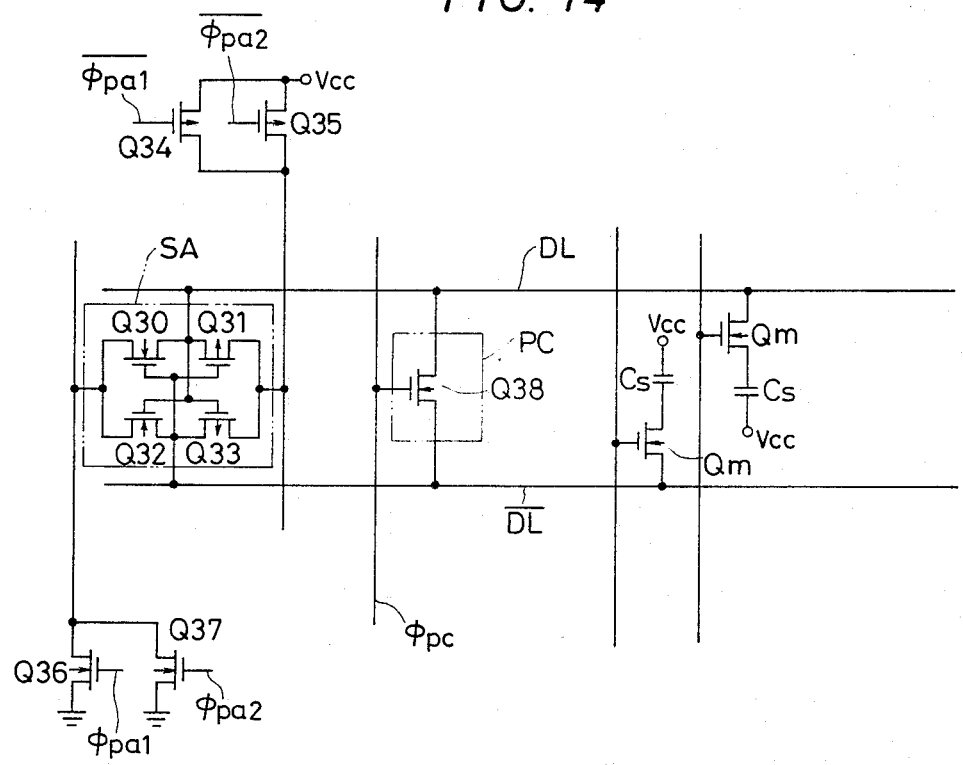
FIG. 14 shows a circuit diagram of a half precharge type memory.

The half-precharge memory portion is constructed as, for example, the circuit shown in FIG. 14.

The sense amplifier SA is constructed of the complementary MOSFET Q30 to Q33, so that complementary data lines DL and $\overline{DL}$ can be driven from the half-precharge level to the level of the power voltage. To control the operation of the sense amplifier SA, switches MOSFET Q34 to Q37 are provided at the side of power supply of the circuit and the earthing.

The precharge circuit PC consists of a n-channel MOSFET Q38 which is operated so as to mutually short-circuit complementary data lines DL and $\overline{DL}$. The level of complementary data lines DL and $\overline{DL}$ prior to the start of the precharge operation is set substantially to the level Vcc and the earth potential (0 volt) of the circuit by previous operation of the sense amplifier SA. Correspondingly, the precharge level of complementary data lines DL and $\overline{DL}$ after the operation of the precharge circuit PC becomes substantially half as high as the power voltage Vcc.

In case of the half-precharge memory, since the difference between the precharge level and the high and low level of the signal is small, the time can be made smaller from the operation of sense amplifier SA until the time when the level of complementary data lines DL and $\overline{DL}$ is decided. Therefore, the half-precharge memory can be operated at a high speed and is suited for use in the image processing.

According to the present invention, following advantages can be obtained.

(1) Setting of function can be easily performed, since signals from the address terminal can be taken in as the function signal through the similar operation as in the memory access operation by the combination of the feed timing of the substantial chip selection signal and the level of other timing signal to control signal.

(2) The function setting operation and the $\overline{CAS}$ before $\overline{RAS}$ refresh operation can be concurrently performed, since the function signal is taken in as the signal fed from the address terminal by discriminating the column address strobe signal $\overline{CAS}$ and the write enable signal $\overline{WE}$ to be on the low level prior to the trailing timing of the row address strobe signal $\overline{RAS}$ which is substantially the chip selection signal.

(3) The function signal composed of the multiple bits can be formed by taking in the function signal form the address terminal. Thus a variety of function setting are made possible.

(4) The information stored in the memory cell which is selected by its addressing within one write cycle can be replaced by the result of operation of that stored information and the write signal fed from the external terminal. Consequently, the image processing for the preparation or modification of graphics can be performed at a high speed.

(5) As one of the functions of the function modes, by masking any particular bit(s) of a plurality of bits signal, without paying attention to the information stored in the memory cell which should not be modified, the operation of the write signal from the external signal can be performed, which allows the preparation or modification of graphics to be easily made.

(6) As can be seen from (4) and (5), the burden imposed upon the microprocessor or image processor etc. can be relieved, while the programming for that can be easily performed.

(7) The write operation can be effected at a high speed without being attended with the operation, since the bypass circuit is provided which transmits the output signal of the data input circuit directly to the input-/output node at memory portion without being passed through the operation circuit.

The invention made by the inventor is described in detail with reference to the embodiment, but this invention is not confined to the above described embodiments, but various modifications are of course possible without departing from the essence and the spirit of it. For instance, the input terminal of the data input circuit and the output terminal of the data output terminal may be coupled to the common external terminal to reduce the number of the external terminals. In this case, the control of the operation is implemented by feeding the output enable signal to the timing control circuit to control the operation of the above data input circuit and data output circuit. The timing signal may be formed for outputting the information stored in RAM at the memory portion parallel to the shift register SR by setting the above output enable signal to the level different from the ordinary operation before the substantial chip selection signal. The operation circuit may perform the other arithmetic operation than the logical operation. The row (X) address signal and the column (Y) address signal may be fed respectively from the indepent terminals. In this case, since the access to RAM is initiated by the chip selection signal, the function setting operation can be achieved by the combination of it and the write enable signal via either of the above address terminals and the address buffer which receives the signal. The refresh operation may be performed by the refresh control signal fed from the external terminal. In his case, since the refresh cycle can be set from the external terminal, the parallel transfer to the shift register can also be performed for the above serial read operation, concurrently with the refresh operation. Furthermore, the release of the function setting may be automatically performed immediately after the completion of write cycle after the setting operation. The memory array may be composed of the static memory cells. Mask signals MS0 to MSS for masking the operational action may be set, depending on the input fed from the data terminal Di, for example, instead of the address terminals AT0 to ATi. In this case, since the input signal for the mask signal is fed to the data terminal Di, and the input signal for the operation mode of the operation circuit is fed to the address terminal, those input signals are easily formed.

The present invention can be widely applied to the semiconductor memory device provided with a variety of data processing functions as well as to the image processing.

We claim:

1. A semiconductor memory device formed on one chip used for image processing comprising:
   a memory portion for storing image data;
   an internal circuit coupled to said memory portion to provide said image data to said memory portion, wherein said internal circuit has a plurality of operation modes which are respectively selected in accordance with a function signal so that the image data to be provided to said memory portion in each operation mode is determined by said function signal;
   an address input terminal; and
   a function setting circuit coupled to receive an input signal from said address input terminal, said function setting circuit including means for forming said function signal in accordance with said input signal;
   an output terminal; and
   a parallel to serial converter coupled between said memory portion and said output terminal for storing signals read out in parallel from said memory portion and for supplying said signals to said output terminal serially.

2. A semiconductor memory device formed on one chip used for image processing as defined in claim 1, wherein said device comprises a timing control circuit which receives a chip selection signal and a first control signal, wherein said timing control circuit is coupled to said function setting circuit and includes means for forming a first timing signal in accordance with said chip selection signal and said first control signal, said first timing signal being provided to said function setting circuit to control the operation of said function setting circuit with respect to receiving said input signal.

3. A semiconductor memory device formed on one chip used for image processing as defined in claim 2, wherein said function setting circuit has a hold means for maintaining the level of said function signal based on said first timing signal until said first timing signal is generated again.

4. A semiconductor memory device formed on one chip used for image processing as defined in claim 2, further comprising an address buffer having an input terminal which is coupled to said address input terminal, the input signal being fed via said address buffer to said function setting circuit.

5. A semiconductor memory device formed on one chip used for image processing as defined in claim 4, wherein said address buffer comprises an address buffer for receiving a row address signal and a column address signal which are fed to said address input terminal in accordance with a time sharing system and further wherein said chip selection signal comprises a row address strobe signal, and said first control signal is composed of a column address strobe signal and a write enable signal.

6. A semiconductor memory device formed on one chip used for image processing as defined in claim 5, wherein said memory portion comprises a dynamic random access memory including a plurality of dynamic memory cells.

7. A semiconductor memory device formed on one chip used for image processing as defined in claim 6, further comprising a refresh control circuit for forming at least a refresh address signal for designating a dynamic memory cell to be refreshed from said memory portion.

8. A video-RAM device according to claim 1, wherein said parallel to serial converter is comprised of a register.

9. A semiconductor memory device according to claim 8, wherein the register includes four shift registers, each of which receives a work of stored image data in parallel from the memory portion to represent one of red, blue and green color data an luminance data, and further wherein the register includes means to convert said parallel received words into serial signals to said output terminal in a synchronized relationship with a predetermined raster scan timing of a CRT coupled to said output terminal.

10. A video-RAM device formed on one chip comprising:
   memory means for storing image data;
   a plurality of input terminals;
   logical operation means coupled to said memory means, and to said input terminals, for providing said image data to be written into said memory means, wherein said logical operation means has a plurality of operation modes which are respectively selected in accordance with a plurality of function signals, and includes means for performing a logical operation selected by said function signals based on input data applied to said input terminals and output data read out from said memory means to form said image data to be written into said memory means;
   a plurality of address input terminals;
   function signal generating means coupled to receive input signals from said address input terminals, wherein said function signal generating means includes means for generating said function signals on the basis of input signals applied to said address input terminals;
   an output terminal; and
   a parallel to serial converter coupled between said memory portion and said output terminal for storing signals read out in parallel from said memory portion and for supplying said signals to said output terminal serially.

11. A video-RAM device formed on one chip as defined in claim 10, further comprising control signal generating means coupled to said function signal generating means, wherein said control signal generating means includes means for forming a control signal in accordance with external control signals, and wherein said control signal controls an operation of said function signal generating means with respect to receiving said input signals applied to said address input terminals.

12. A video-RAM device formed on one chip as defined in claim 11, wherein said memory means comprises a dynamic random access memory.

13. A video-RAM device formed on one chip as defined in claim 12, wherein said external control signals include a row address strobe signal, a column address strobe signal, and a write enable signal.

14. A video-RAM device formed on one chip as defined in claim 13, wherein said logical operation means further comprises a transferring means for directly transferring said input data applied to said input terminals to said memory means in accordance with a transferring signal.

15. A video-RAM device formed on one chip as defined in claim 14, further comprising latching means coupled between said logical operation means and said memory means, for latching said output data read out from said memory means so that said latching means provides said output data read out from said memory means to said logical operation means.

16. A video-RAM device formed on one chip as defined in claim 15, further comprising masking means for inhibiting predetermined input data applied to said input terminals at least in accordance with masking signals.

17. A video-RAM device formed on one chip as defined in claim 16, further comprising address buffer means coupled to said memory means, to said function signal generating means, and to said address input terminals, wherein said input signals are fed to said function signal generating means via said address buffer means.

18. A video-RAM device formed on one chip as defined in claim 17, further comprising a refresh control means for forming at least a refresh signal for designating a dynamic memory cell to be refreshed from said memory means, wherein said refresh control means forms said refresh signal when said control signal generating means forms said control signal.

19. A semiconductor memory device according to claim 10, wherein said parallel to serial converter is comprised of a register.

20. A video RAM device according to claim 19, wherein the register includes four shift registers, each of which receives a word of stored image data in parallel from the memory means to represent one of red, blue and green color data and luminance data, and further wherein the register includes means to convert said parallel received words into serial signals to said output terminal in a synchronized relationship with a predetermined raster scan timing of a CRT coupled to said output terminal.

21. A semiconductor memory device used for image processing comprising:
a memory portion for storing image data, wherein said memory portion includes means to allow a plurality of image data stored therein to be rewritten;
an operation circuit coupled to receive input data applied to input terminals and output data read out from said memory portion, wherein said operation circuit includes means for performing a logical operation based on said input and output data to form operation image data to be written into said memory portion;
a function setting circuit;
a bypass circuit the operation of which is controlled by a control signal fed from said function setting circuit to feed said input data directly to said memory portion in accordance with a predetermined level of said control signal;
an output terminal; and
a parallel to serial converter coupled between said memory portion and said output terminal for storing signals read out in parallel from said memory portion and for supplying said signals to said output terminal serially.

22. A semiconductor memory device used for image processing as defined in claim 21, wherein said operation circuit has a plurality of operation modes and said function setting circuit outputs operation control signals for selecting predetermined ones of said operation modes in accordance with said operation control signals.

23. A semiconductor memory device used for image processing as defined in claim 22, further comprising a timing control circuit the operation of which is controlled by a plurality of external control signals, wherein, when said plurality of external control signals are set to a predetermined state, a timing control signal is formed by said timing control circuit for setting said function setting circuit to perform a predetermined input operation, said function setting circuit having a hold means for maintaining an operation control signal and said control signal for said bypass circuit after said input operation.

24. A semiconductor memory device used for image processing as defined in claim 23, further comprising an address input terminal and a coupling means including an address buffer for coupling said address input terminal and the input terminal of said function setting circuit.

25. A semiconductor memory device according to claim 21, wherein said parallel to serial converter is comprised of a register.

26. A semiconductor memory device according to claim 25, wherein the register includes four shift registers, each of which receives a word of stored image data in parallel from the memory portion to represent one of red, blue and green color data and luminance data, and further wherein the register includes means to convert said parallel received words into serial signals to said output terminal in a synchronized relationship with a predetermined raster scan timing of a CRT coupled to said output terminal.

27. A video-RAM device formed on one chip comprising:
a memory means for storing data;
a plurality of input terminals;
logical operation means coupled to said memory means, and to said input terminals, for providing data to be written into said memory means, wherein said logical operation means has a plurality of operation modes which are respectively selected in accordance with a plurality of function signals, and includes means for performing a logical operation selected by said function signals based on input data applied to said input terminals and output data read out from said memory means to form said data to be written into said memory means;

a plurality of address input terminals; and function signal generating means coupled to receive input signals from said address input terminals, wherein said function signal generating means includes means for generating said function signals on the basis of input signals applied to said address input terminals, further comprising control signal generating means coupled to said function signal generating means wherein said control signal generating means includes means for forming a control signal in accordance with external control signals, and wherein said control signal controls an operation of said function signal generating means with respect to receiving said input signals applied to said address input terminals.

28. A video-RAM device formed on one chip as defined in claim 27, wherein said memory means comprises a dynamic random access memory.

29. A video-RAM device formed on one chip as defined in claim 28, wherein said external control signals include a row address strobe signal, a column address strobe signal, and a write enable signal.

30. A video-RAM device formed on one chip as defined in claim 29, wherein said logical operation means further comprises a transferring means for directly transferring said input data applied to said input terminals to said memory means in accordance with a transferring signal.

31. A video-RAM device formed on one chip as defined in claim 30, further comprising latching means coupled between said logical operation means and said memory means, for latching said output data read out from said memory means so that said latching means provides said output data read out from said memory means to said logical operation means.

32. A video-RAM device formed on one chip as defined in claim 31, further comprising masking means for inhibiting predetermined input data applied to said input terminals at least in accordance with masking signals.

33. A video-RAM device formed on one chip as defined in claim 32, further comprising address buffer means coupled to said memory means, to said function signal generating means, and to said address input terminals, wherein said input signals are fed to said function signal generating means via said address buffer means.

34. A video-RAM device formed on one chip as defined in claim 33, further comprising a refresh control means for forming at least a refresh signal for designating a dynamic memory cell to be refreshed from said memory means, wherein said refresh control means forms said refresh signal when said control signal generating means forms said control signal.

35. In an address multiplexed dynamic RAM, a circuit arrangement comprising:
a memory portion for storing data;
a logic circuit coupled to said memory portion and having a plurality of operation modes which are respectively selected in accordance with a mode selecting signal;
control mans coupled to said logic circuit for controlling said logic circuit;
a first external terminal coupled to said control means for receiving a row address strobe signal;
a second external terminal coupled to said control means for receiving a column address strobe signal;
a third external terminal coupled to said control means for receiving a write enable signal; and
a fourth external terminal coupled to said control means for receiving said mode selecting signal;
wherein a predetermined one of said operation modes is selected by said control means in response to said column address strobe signal, coupled to said control means by said second external terminal being at a logic "low " level and said write enable signal, coupled to said control means by said third external terminal, being at a logic "low " level when said row address strobe signal, coupled to said control means by said first external terminal, is at a transitional logic level corresponding to a falling edge and when said mode selecting signal, coupled to said control means by said fourth external terminal, is at a predetermined logic level.

36. An address multiplexed dynamic RAM according to claim 35, wherein said fourth external terminal is an address input terminal.

37. An address multiplexed dynamic RAM according to claim 36, wherein the data to be provided to said memory portion in each operation mode is determined by said mode selecting signal.

38. An address multiplexed dynamic RAM according to claim 37, wherein said address multiplexed dynamic RAM is formed on one chip used for image processing.

39. In an address multiplexed dynamic RAM, a circuit arrangement comprising:
a first external terminal for receiving a row address strobe signal;
a second external terminal for receiving a column address strobe signal;
a third external terminal for receiving a write enable signal;
a fourth external terminal for receiving a mode selecting signal;
a fifth external terminal for receiving input data;
a memory portion for storing data;
a logic portion coupled to said memory portion and having mans for performing a logic operation selected by said mode selecting signal based on said input data and output data read out from said memory portion to form said data to be written into said memory portion; and
control means coupled to said first, second, third and fourth external terminal and to said logic portion for controlling said logic portion,
wherein said logic operation is selected in response to said column address strobe signal, coupled to said control means by said second external terminal, being at a logic "low" level and said mode selecting signal, coupled to said control means by said fourth external terminal, being at a predetermined logic level when said row address strobe signal, coupled to said control mans by said first external terminal, is at a transitional logic level corresponding to a falling edge.

40. An address multiplexed dynamic RAM according to claim 39, wherein said fourth external is an address input terminal.

41. An address multiplexed dynamic RAM according to claim 40, wherein said address multiplexed dynamic RAM is formed on one chip used for image processing.

42. A method of selecting one of a plurality of operation modes in an address multiplexed dynamic RAM having a first external terminal for receiving a row address strobe signal, a second external terminal for receiving a column address strobe signal, a third external terminal for receiving a write enable signal, a fourth external terminal for receiving a mode selecting signal, and a logic portion having said plurality of operation modes which are respectively selected in accordance with said modes selecting signal, said method of selecting one of said plurality of operation modes comprising the steps of:

(a) making said column address strobe signal a logic "low" level;
(b) making said write enable signal a logic "low" level; and
(c) making said row address strobe signal a logic "low" level after said steps (a) and (b).

* * * * *